(12) United States Patent
Lind

(10) Patent No.: US 6,201,400 B1
(45) Date of Patent: Mar. 13, 2001

(54) BULLS-EYE MID-FREQUENCY IMPEDANCE PROBE

(75) Inventor: Arthur C. Lind, Chesterfield, MO (US)

(73) Assignee: The Boeing Company, St. Louis, MO (US)

( * ) Notice: Subject to any disclaimer, the term of this patent is extended or adjusted under 35 U.S.C. 154(b) by 0 days.

(21) Appl. No.: 09/103,369

(22) Filed: Jun. 23, 1998

(51) Int. Cl.⁷ .............................. G01N 27/72; G01R 33/00
(52) U.S. Cl. ........................ 324/687; 324/642; 324/601
(58) Field of Search .................................. 324/601, 687, 324/642, 690, 632

(56) References Cited

U.S. PATENT DOCUMENTS

| | | |
|---|---|---|
| 3,400,331 | 9/1968 | Harris . |
| 3,805,150 | 4/1974 | Abbe . |
| 3,879,644 | 4/1975 | Maltby . |
| 4,281,286 | 7/1981 | Briggs . |
| 4,503,384 | 3/1985 | Nagy et al. . |
| 4,569,445 | 2/1986 | Kovats et al. . |
| 4,866,370 | 9/1989 | Flemming et al. . |
| 5,077,522 | 12/1991 | Lahitte et al. . |
| 5,122,754 | 6/1992 | Gotaas . |
| 5,157,337 | 10/1992 | Neel et al. . |
| 5,313,166 * | 5/1994 | Eul ......................................... 324/601 |
| 5,389,875 * | 2/1995 | Rosen ..................................... 324/642 |
| 5,394,097 | 2/1995 | Bechtel et al. . |
| 5,426,373 | 6/1995 | Diamond et al. . |
| 5,436,565 | 7/1995 | Gammell . |
| 5,491,423 | 2/1996 | Turetta . |
| 5,541,522 | 7/1996 | Rosen et al. . |
| 5,585,732 | 12/1996 | Steele et al. . |
| 5,602,486 | 2/1997 | Novak . |
| 5,654,643 | 8/1997 | Bechtel et al. . |
| 5,661,404 * | 8/1997 | Yanagawa ............................. 324/601 |

* cited by examiner

Primary Examiner—Safet Metjahic
Assistant Examiner—Jose M. Solis
(74) Attorney, Agent, or Firm—Alston & Bird LLP

(57) ABSTRACT

The bulls-eye mid-frequency impedance probe has probe electrodes of a larger surface area that conform to the test surface to provide a very low impedance coupling between the probe and surface, unlike other open end coaxial probes. This probe provides accurate measurement of the dielectric properties of dielectric materials in the mid-frequency range of 10 MHz to 1 GHz on flat and curved solid surfaces, while conforming simple or complex curved surfaces by providing a resilient means between the probe contact surface and the probe box.

11 Claims, 7 Drawing Sheets

| | 0.0000 | PROBE CONSTANT USED = 1970 | | | | |
|---|---|---|---|---|---|---|
| RECORD#/CODE | LOCATION/MAG | MAG/PHAS | PHAS/MAG | EP'/PHAS | EP"/LEN/-FREQ | TIME |
| -1.0000 | 105.3100 | -96.9300 | 26.3200 | 94.8800 | 5.8602 | 05-08-1997 |
| -2.0000 | 26.3200 | 94.8800 | -0.0000 | -0.0000 | 155.0000 | 13:21:14 |
| -3.0000 | TEFLON | | | | | |
| 1.0000 | 10.0000 | 98.2200 | -96.6000 | 2.0964 | -0.0119 | 13:22:16 |
| -3.0000 | ALUMINA | | | | | |
| 2.0000 | 20.0000 | 70.7300 | -95.2900 | 7.8542 | -1.1257 | 13:23:28 |
| 3.0000 | 20.0000 | 70.4000 | -95.2900 | 7.9429 | -0.1228 | 13:24:30 |
| -3.0000 | MICROCELL AFT STRAIGHT L/H | | | | | |
| 4.0000 | 30.000 | 86.7300 | -88.1100 | 4.2036 | -2.4119 | 13:25:56 |
| -3.0000 | #5 DIELECTRIC | | | | | |
| -1.0000 | 101.9900 | -96.7700 | 26.3200 | 94.8800 | 5.8602 | 05-08-1997 |
| -2.0000 | 50.0000 | -94.4000 | 3.4351 | -146.6409 | 155.0000 | 13:29:17 |
| 5.0000 | 10.0000 | 96.0500 | -96.4400 | 2.0337 | -0.0288 | 13:30:03 |
| 6.0000 | 20.0000 | 76.2500 | -95.4600 | 8.8510 | -0.1810 | 13:30:47 |
| -3.0000 | NO DIELECTRIC, BUT USE DIELECTRIC CAL | | | | | |
| 7.0000 | 10.0000 | 98.2200 | -96.6000 | 1.6258 | -0.0051 | 13:32:16 |
| 8.0000 | 20.0000 | 70.4000 | -95.2900 | 13.3915 | -0.1619 | 13:33:23 |
| 9.0000 | 30.0000 | 86.7300 | -88.1100 | 3.6147 | -3.6014 | 13:33:54 |
| -3.0000 | USE DIELECTRIC #5 | | | | | |
| 10.0000 | 30.0000 | 78.6000 | -90.9800 | 7.1170 | -3.2957 | 13:35:02 |
| 11.0000 | 30.0000 | 87.6000 | -90.7700 | 3.8017 | -2.3997 | 13:36:07 |
| -1.0000 | 105.2600 | -96.9100 | 26.3200 | 94.8800 | 5.8602 | 05-08-1997 |
| -2.0000 | 26.3200 | 94.8800 | -0.0000 | -0.0000 | 155.0000 | 13:38:15 |
| -3.0000 | NOW USE SHEET BUT DON'T CAL FOR IT | | | | | |
| 12.0000 | 10.0000 | 96.1200 | -96.4500 | 2.4387 | -0.0261 | 13:39:38 |
| 13.0000 | 20.0000 | 76.700 | -95.4200 | 6.3381 | -0.1337 | 13:41:17 |
| -3.0000 | 40=NYLON | DONE WITHOUT DIELECTRIC | | | | |
| 14.0000 | 40.0000 | 92.4700 | -95.8800 | 3.0812 | -0.1503 | 13:51:47 |
| -3.0000 | USE NEW PROBE #2 FLEX | | | | | |
| -1.0000 | 94.3400 | -96.5000 | 14.0000 | 97.2800 | 3.2859 | 05-08-1997 |
| -2.0000 | 14.0000 | 97.2800 | -0.0000 | 0.0000 | 155.0000 | 13:57:11 |
| 15.0000 | 10.0000 | 88.4000 | -96.2500 | 2.1450 | -0.0005 | 13:57:47 |
| 16.0000 | 20.0000 | 63.2700 | -95.1500 | 8.9341 | -0.0773 | 13:58:17 |
| 17.0000 | 30.0000 | 77.5900 | -88.1200 | 4.6181 | -2.6458 | 13:59:54 |
| 18.0000 | 40.0000 | 83.9300 | -95.6400 | 3.1057 | -0.1403 | 14:01:00 |
| -1.0000 | 91.1000 | -96.3000 | 14.0000 | 97.2800 | 3.2859 | 05-08-1997 |
| -2.0000 | 43.0000 | -94.3200 | 2.0809 | -114.7965 | 155.0000 | 14:04:01 |
| 19.0000 | 10.0000 | 86.3100 | -96.1100 | 2.0295 | 0.0027 | 14:04:30 |
| 20.0000 | 20.0000 | 68.8900 | -95.2300 | 8.9906 | -0.1238 | 14:05:13 |
| 21.0000 | 30.0000 | 78.4500 | -90.7800 | 4.0977 | -2.4129 | 14:07:20 |
| 22.0000 | 40.0000 | 83.4000 | -95.7000 | 2.7803 | -0.1125 | 14:08:07 |
| 23.0000 | 40.0000 | 82.2600 | -95.5900 | 3.1034 | -0.1437 | 14:09:45 |
| -3.0000 | RECORD 22 WAS ROUGH NYLON SURFACE | | | | | |

FIG. 7.

| 0.0000 | PROBE CONSTANT USED = 1812 | | | | | |
|---|---|---|---|---|---|---|
| TYPE -1 | Air Z_Mag | Z_Phas | Short Z_Mag | Z_Phas | Length (inch) | Date |
| TYPE -2 | Spacer Z_Mag | Z_Phas | ReZ_Diel | ImZ_Diel | Freq (MHz) | Time |
| TYPE -3 | COMMENT | | | | | |
| Meas.# | SAMPLE# | SampleZ_Mag | Z_Phas | EP' | EP'' | Time |
| -1.0000 | 94.4800 | -96.4800 | 42.3500 | 94.3900 | 8.7950 | 05-14-1997 |
| -2.0000 | 42.3500 | 94.3900 | -0.0000 | 0.0000 | 150.0000 | 16:47:22 |
| -3.0000 | Cal was made with no dielectric spacer | | | | | |
| -3.0000 | Sample # 10 is Teflon | | | | | |
| 1.0000 | 10.0000 | 88.1800 | -96.1900 | 2.1057 | -0.0190 | 16:48:56 |
| -3.0000 | Sample #20 is Nylon | | | | | |
| 2.0000 | 20.0000 | 83.1300 | -95.5500 | 3.0769 | -0.1550 | 16:50:13 |
| -3.0000 | Sample #30 is Low-density Alumina | | | | | |
| 3.0000 | 30.0000 | 61.8600 | -95.0600 | 8.1602 | -0.1450 | 16:51:29 |
| -3.0000 | Now calibrate using a dielectric spacer about 0.040' thick. | | | | | |
| -1.0000 | 92.3900 | -96.4300 | 42.3300 | 94.4400 | 8.7920 | 05-14-1997 |
| -2.0000 | 22.8000 | -94.4900 | 2.1140 | -73.1236 | 150.0000 | 17:06:09 |
| -3.0000 | Measurements now made using dielectric spacer. | | | | | |
| 4.0000 | 10.0000 | 86.3800 | -96.0700 | 2.1370 | -0.0451 | 17:08:26 |
| 5.0000 | 20.0000 | 82.0200 | -95.5000 | 3.1099 | -0.1909 | 17:10:13 |
| 6.0000 | 30.0000 | 65.5100 | -95.0700 | 8.5591 | -0.2215 | 17:12:25 |

FIG. 10.

BULLS-EYE MID-FREQUENCY IMPEDANCE PROBE

FIELD OF THE INVENTION

The field of the present invention is surface probes capable of characterizing the dielectric properties of a material, especially test specimens having a curved surface.

BACKGROUND OF THE INVENTION

Methods of characterizing the electrical dielectric characteristics of large, curved solid surfaces have lacked an accurate means of testing at mid-range frequencies.

Information about the complex dielectric properties at mid-range frequencies is important because the manufacturing tolerances at these frequency ranges is difficult to control and such properties can vary widely. Moreover, variations in application of such materials can change the dielectric properties. Non-destructive testing of such applications with possibly large curved surfaces requires a portable probe adjustable to a range of materials and contours.

It is known at high frequencies that electromagnetic radiation can be directed at a sample from a transmitting horn antenna to a receiving horn antenna, with the characteristics determined by the change in transmission from the calibration condition to no test specimen in between to when the test specimen impedes the transmission.

It is also known that open-ended coaxial-line probes can be inserted into liquid materials in order to test dielectric properties at mid-range frequencies, 10 MHz to 1 GHz This technique is described in T. P. Marsland, "Dielectric measurements with an open-ended coaxial probe", *IEE Proceedings*, Vol. 134, Pt. H, No. 4, pp. 341–348, August 1987.

Attempts have been made to make probes that will test curved solid surfaces, such as in U.S. Pat. No. 5,541,522 by Rosen et al. Such probes rely upon slender, spring-loaded pins extending out to make contact with the test surface. The accuracy of such probes is limited because the small contact area of the pins provides poor, high-impedance coupling to the test source. The coupling also changes with surface curvature.

SUMMARY OF THE INVENTION

This invention satisfies the above needs. The probe electrodes have a larger surface area and conform to the test surface to provide a very low impedance coupling between the probe and surface.

The bulls-eye mid-frequency impedance probe has probe electrodes of a larger surface area that conform to the test surface to provide a very low impedance coupling between the probe and surface, unlike other open end coaxial probes. This probe provides accurate measurement of the dielectric properties of dielectric materials in the mid-frequency range of 10 MHz to 1 GHz on flat and curved solid surfaces, while conforming to simple or complex curved surfaces by providing a resilient means between the probe contact surface and the probe box.

BRIEF DESCRIPTION OF THE DRAWINGS

FIG. 7 is a table of the experimental results using the prototype bulls-eye probe device and method, including use of the EPROBE BASIC computer program.

FIG. 10 is an additional table of the experimental results using the prototype bulls-eye probe device and method, including use of the EPROBE FORTRAN computer program.

DETAILED DESCRIPTION OF THE INVENTION

The present invention now will be described more fully hereinafter with reference to the accompanying drawings, in which a preferred embodiment of the invention is shown. This invention may, however, be embodied in many different forms and should not be construed as limited to the embodiments set forth herein; rather, this embodiment is provided so that this disclosure will be thorough and complete, and will fully convey the scope of the invention to those skilled in the art. Like numbers refer to like elements throughout.

Figure 3:
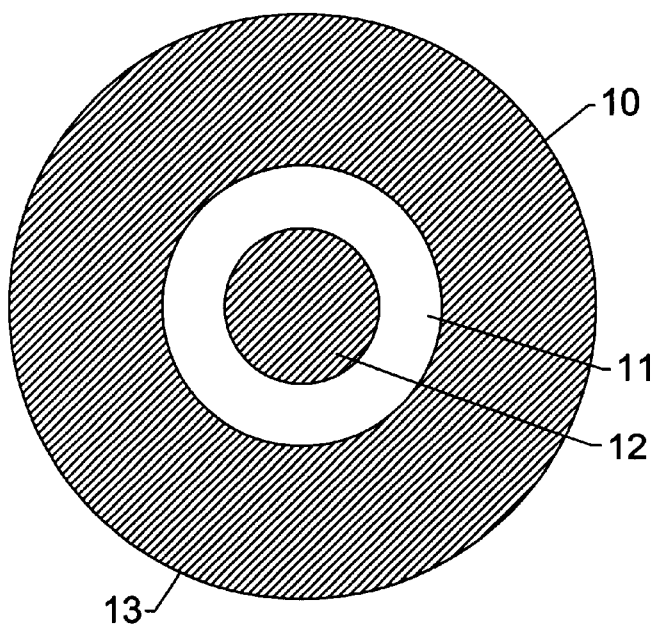
FIG. 3 is a front-view depiction of contact surface of bulls-eye probe.

Referring to the front view in FIG. 3, the key to the structure of the bulls-eye mid-frequency dielectric probe is the contact surface (13) which has an internal conductor (12), a relief ring etched into conductive coating on circuit board (11); and an external conductor (10).

Figure 2:
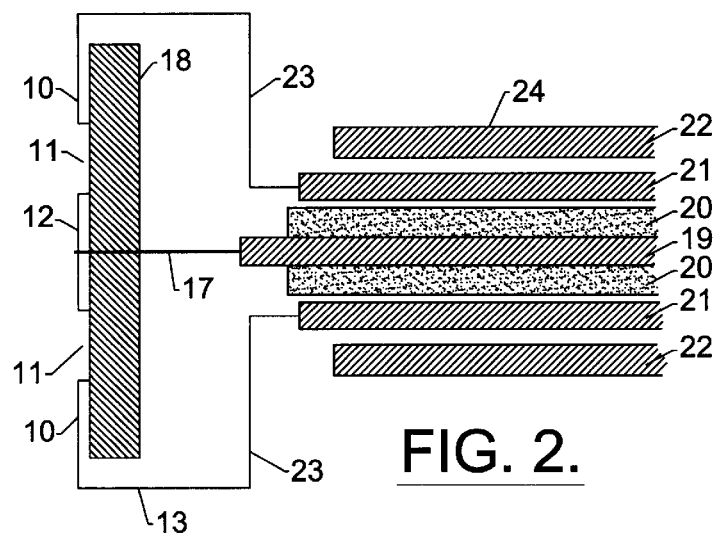
FIG. 2 is a functional schematic of bulls-eye probe and coaxial conductor.

Referring to the side view in FIG. 2, the contact surface is functionally related electrically to a coaxial cable as follows. The internal conductor (12) and external conductor (10), both shown in cross section, are held in relative position by being attached to a flexible nonconductive substrate (18), such as a flexible circuit board. The external conductor (10) makes electrical connection via an external conducting outer connection (23) to coaxial outer conductor (21) of the coaxial cable (24). The internal conductor (12) makes electrical connection via a inner conducting outer connection (17) to the coaxial central conductor (19) of the coaxial cable (24).

Figure 1:
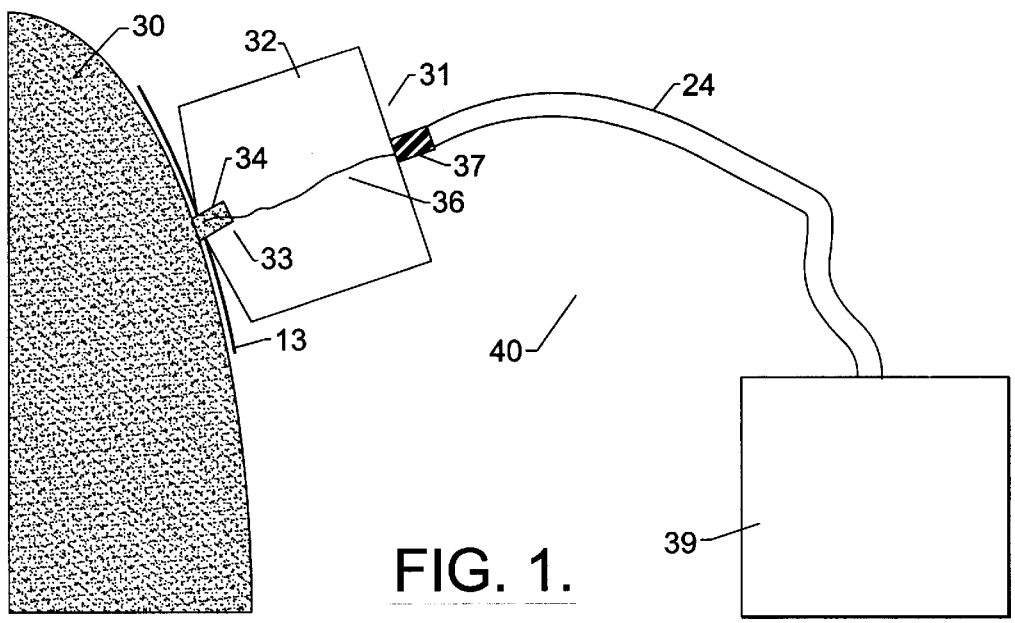
FIG. 1 is a side-view depiction of bulls-eye probe apparatus being used on a curved test specimen.

In the preferred embodiment shown in FIG. 1, the prototype bulls-eye probe has the flexible contact surface (13) is rigidly attached at opposite edges to the probe box (32). This allows the contact surface (13) to adapt to a simple curved surface by placing the rigidly attached edges of the contact surface (13) in line with the non-curved direction of a convex surface and in line with the curved direction of a concave surface.

Figure 6:
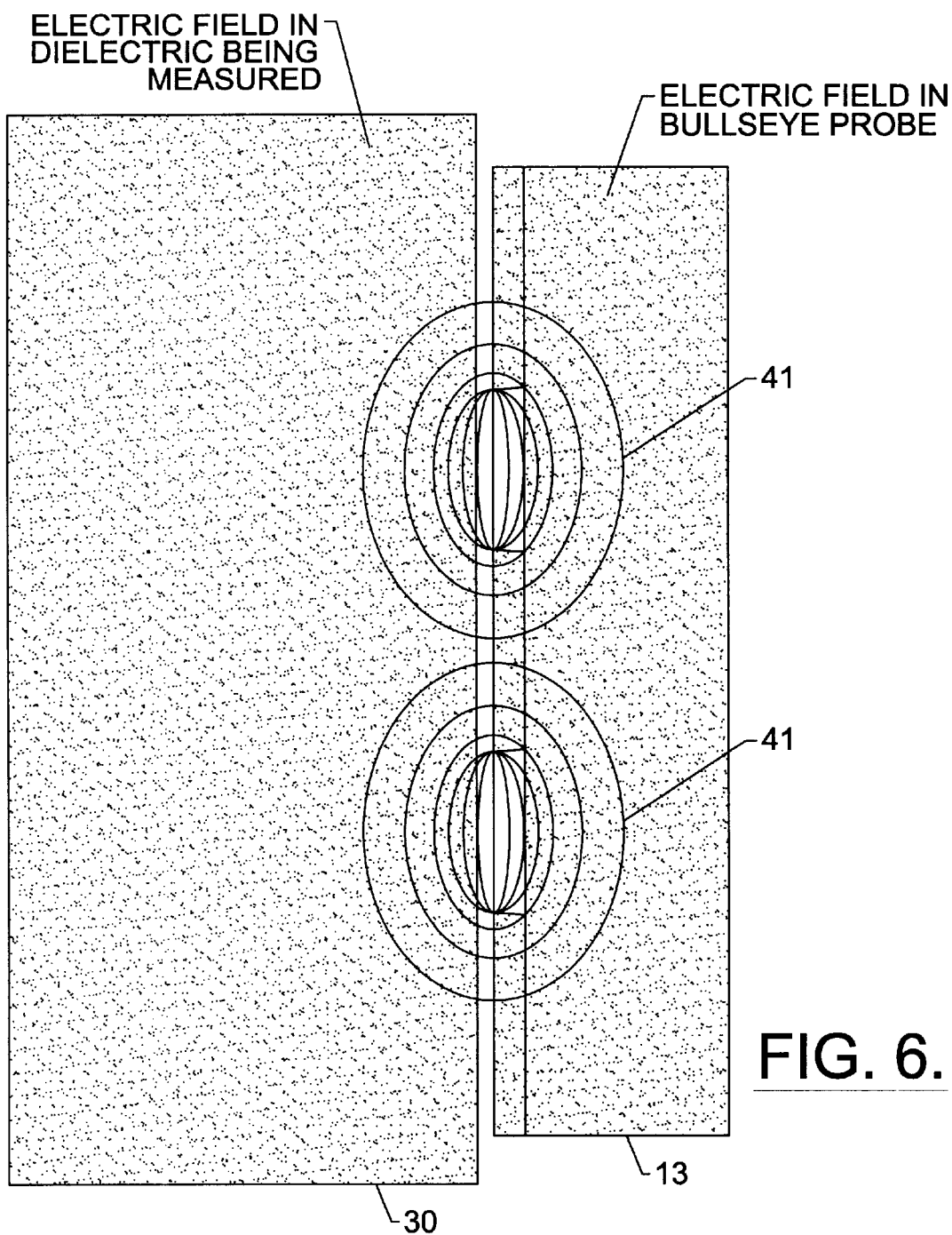
FIG. 6 is a depiction of electrical flux lines when using bulls-eye probe on test specimen.

The inventive contact surface of the probe provides unique electric field lines, shown in the side view depiction of FIG. 6. Electric fields flux lines (41) extend from the center of the bull's eye contact surface (13) into the dielectric being measured and back to the outer ring of the bull's eye. There are similar field lines on the other side, the side that is enclosed within the metal probe box (32) that serves as a shield and a handle for the operator. In the metal probe box (32) there are additional field lines from the center of the bull's eye to the walls of the box.

It is anticipated that the attachment between the flexible contact surface (13) and the probe box (32) could be made with a large number of ways allowing the probe to be used on complex curved surfaces. For example, a compressible material or an arrangement of mechanical springs could be placed between the flexible contact surface (13) and the probe box (32).

It is further anticipated that a number of connecting wires and connection means to the signal processing device could be used in addition to coaxial cable.

It is also anticipated geometric shape and orientation of the internal conductor (12) and external conductor (13) could take many different forms and dimensions, as well as from other materials than a copper coated circuit board with an etched portion.

It is additionally anticipated that the probe box could be replaced with many means and shapes of transferring physical force to the flexible contact surface such that the contact surface adapts to the shape of the sample. Moreover, the probe box could be eliminated allowing force directly to the contact surface, although this is not the preferred embodiment given the electrical insulation requirements and vulnerability of electrical conductors.

Figure 8:
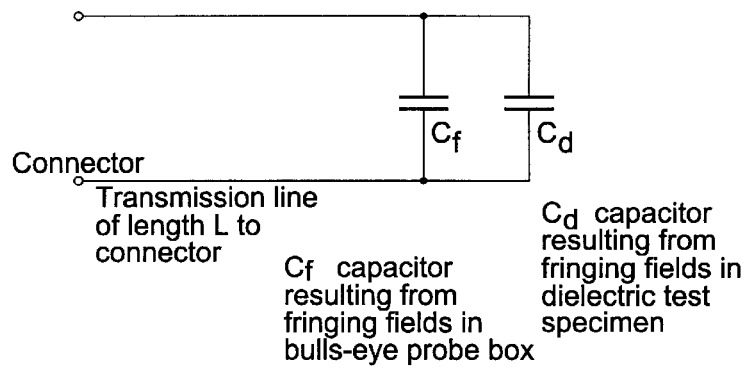
FIG. 8 is an equivalent circuit model of the probe with a test specimen.

FIG. 8 shows the equivalent circuit of probe. $C_d$ is the capacitor that results from the fields in the dielectric being measured. It changes as the probe contacts different dielectric materials. A quasi-static analysis shows that the dielectric constant of the material under test, $\epsilon_d$, is linearly related to the value of the capacity $C_d$. That is, $$C_d = A_1 \epsilon_d$$

Where $A_1$ is a constant determined by the geometry of the probe.

Figure 4:
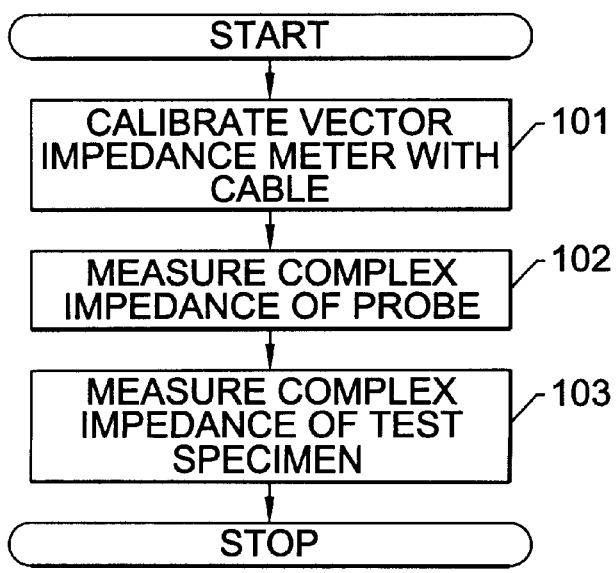
FIG. 4 is a top-level flow diagram of bulls-eye probe method.
Figure 5:
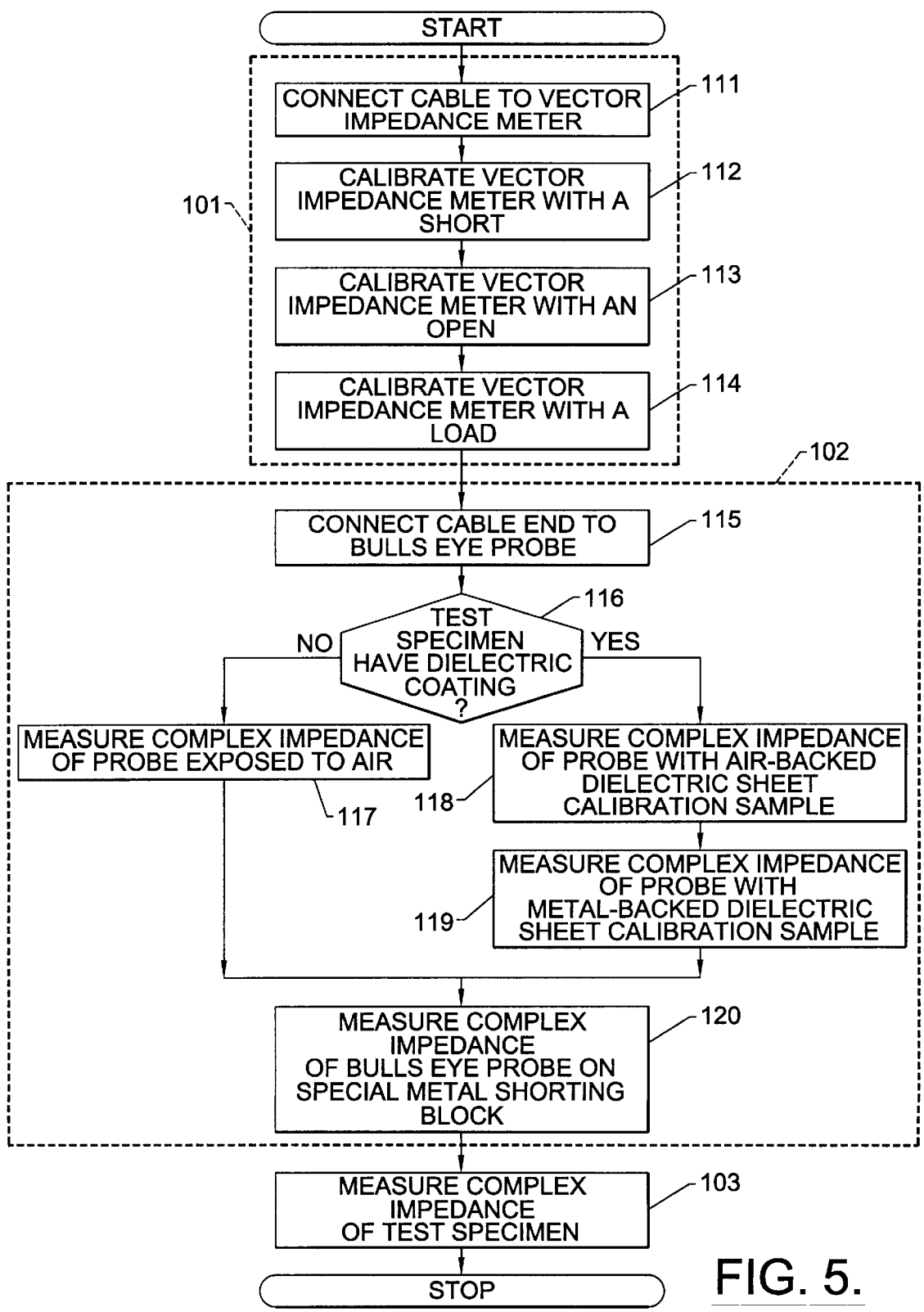
FIG. 5 is an expanded flow diagram of bulls-eye probe method.

The present invention also includes a method for employing a dielectric probe such as the apparatus discussed above. As summarized in FIG. 4, the inventive method includes the steps of (a) calibrating a signal processing device such as a vector impedance meter with the coaxial cable (101); (b) measuring the complex impedance of the bulls-eye probe (102); (c) and measuring the complex impedance of the test specimen (103). Each of these steps is explained in greater detail in FIG. 5 and the description below:

The first major step of the method is the Electrical Cable Calibration Procedure (101) which includes the following steps: connecting the open-ended coaxial cable to signal processing device such as a vector impedance meter (111); calibrating the signal processing device with the probe-end of the coaxial cable shorted, such as with a conductive plate (112); calibrating the signal processing device with the probe-end of the coaxial cable open (113); and calibrating the signal processing device with a known impedance load (114).

In actual operation, the complex impedance, $Z_m$, is measured at the connector. This measured impedance, $Z_m$, includes the effects of $C_d$, $C_f$ and the length, L, of the connecting wire. The effects of $C_f$ and L are removed from the measurement to accurately determine $C_d$. This is accomplished by performing a calibration as explained below.

The electrical length of the connecting wire from the probe connector to the probe surface is determined by placing the probe surface in intimate electrical contact with an electrically conducting surface and measuring the impedance, $Z_{short}$, at the connector. The impedance, $Z_{short}$, is simply that of a shorted transmission line, namely, $$Z_{short} = jZ_0 \tan(2\pi f L/c).$$

Where $j=\sqrt{-1}$, $Z_0$ is the characteristic impedance of the line, c is the velocity of light, f is the frequency of measurement and L is the electrical length of the line. Since $Z_0$, c and f are known and $Z_{short}$ is measured, L can be determined. For subsequent computations it is sufficient to determine $\theta$.

$$\theta = 2\pi f L/c = \text{atan}(Z_{short}/jZ_0)$$

Again referring to FIG. 5, the second major step is the Probe Calibration Procedure (102) which begins with connecting the probe end of the coaxial cable to the dielectric probe (115). It continues depending on whether or not the test specimen has a dielectric coating or spacer (116). If it does not, measurement is taken of the probe exposed to air (117). If it does, measurement of complex impedance of the probe/cable combination is taken with probe contact surface against an air-backed dielectric sheet calibration sample of the spacer (118). Then measurement of complex impedance of the probe/cable combination is taken with the probe contact surface against a metal-backed dielectric sheet calibration sample of the dielectric spacer (119). Whether or not the test specimen has a dielectric coating, the subsequent step is to measure the complex impedance of the probe/cable combination shorted on a metal block (120).

The fringe capacity, $C_f$, in parallel with the capacity, $C_{air}$, of an air dielectric ($\epsilon_d = \epsilon_{air} = 1$) is determined by measuring the impedance, $Z_{air}$, at the connector while holding the probe in the air away from objects. The measured value of $Z_{air}$ includes the effect of the transmission line of length L. Applying the correction for line length, $$Z_{airCorrected} = \frac{\cos\theta Z_{air} - jZ_0\sin\theta}{-jZ_{air}\sin\theta + Z_0\cos\theta} Z_0$$

Since this is the capacity of $C_f$ and $C_{air}$ in parallel, $$Z_{airCorrected} = \frac{1}{j2\pi f (C_f + C_{air})}$$

The third major step is to measure the complex impedance of the test specimen (103). The probe is place in intimate contact with an unknown material whose dielectric constant is to be measured and $Z_{unk}$ is measured at the connector. This impedance is corrected for line length, L.

$$Z_{unkCorrected} = \frac{\cos\theta Z_{unk} - jZ_0\sin\theta}{-jZ_{unk}\sin\theta + Z_0\cos\theta} Z_0$$

Since this is the capacity of $C_f$ and $C_d$ in parallel, $$Z_{unkCorrected} = \frac{1}{j2\pi f (C_f + C_d)}$$

This impedance, $Z_{unkCorrected}$, includes the shunt impedance of the fringe capacity $C_f$ that must be removed to determine $C_d$. This is done as follows.

This information allows for the correction of measured data to determine unknown dielectric constant: We know that $$C_d = A_1 \epsilon_d,$$

$$C_{air} = A_1 \epsilon_{air} = A_1$$

and $$C_d - C_{air} = A_1(\epsilon_d - 1)$$

From the above equations, we define Z as $$\frac{1}{Z} = \frac{1}{Z_{unkCorrected}} - \frac{1}{Z_{airCorrected}}$$
$$= j2\pi f(C_f + C_d - (C_f + C_{air}))$$
$$= j2\pi f(C_d + C_{air})$$

$$= j2\pi f(C_f + C_d - (C_f + C_{air})) = j2\pi f(C_d - C_{air})$$

Therefore, from the last two equations, $$\varepsilon_d = \frac{1}{j2\pi f Z A_1} + 1.$$

Determination of $A_1$: The value of the $A_1$, the constant based on the geometry of the probe, can be experimentally determined or it can be computed using analytical or numerical techniques. N. Marcuvitz presents one form of an analytical solution in his book, *Waveguide Handbook*, McGraw-Hill, 1951, page 213. His analysis is for a coaxial cable radiating into semi-infinite space, which is close to the geometry of the bull's eye probe.

The calculations provided above mathematically lend themselves to being implemented in a computer program. In the preferred embodiment, a BASIC computer program called EPROBE incorporates the functions of taking inputs of material parameters and processing probe signals. EPROBE analysis also includes the effect of a finite thickness dielectric part being measured. It also includes the effect of an air gap or dielectric spacer between the probe and the dielectric part being measured, as shown in FIG. 7.

Figure 9:
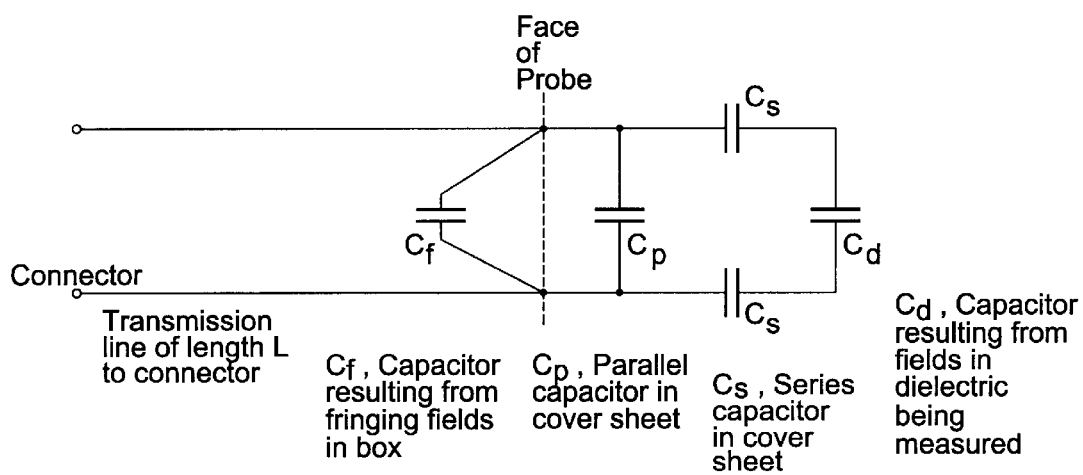
FIG. 9 is the equivalent circuit model for the probe interacting with a test specimen covered in a dielectric spacer.

Correction for Dielectric Spacer between Probe and Material being measured: In some field measurements a thin dielectric sheet may cover the material being measured. One way of representing this is shown schematically in FIG. 9. The capacitor $C_s$ represents the series capacitance caused by the dielectric cover and $C_p$ represents the parallel capacitor caused by the dielectric cover. These capacitors can be included in the analytical calculation of the probe constant $A_1$ or a correction can be done during the measurement if a sample of the cover sheet is available. The value of $C_p$ in parallel with $C_{air}$ and $C_f$ is determined during calibration by placing the sample cover sheet against the probe when making the air calibration. The value of $C_s$ is determined during calibration by placing the sample cover sheet between the probe and a conducting surface. During the data analysis, the measured impedances are corrected for $C_p$ and $C_s$.

The Rosen patent, U.S. Pat. No. 5,541,522 mentioned above, has slender, spring-loaded conducting pins that extend from the face of their probe and provide a small area of contact with the test surface. This small area causes a series impedance that is similar to that of the series capacitors $C_s$ discussed above for the dielectric cover sheet. In the instant invention, even with no dielectric spacer, there will be a small air gap between the probe and test surface, resulting in a series capacitance, $C_s$. However, the error caused by $C_s$ is negligible because in the instant invention the surface area of the probe is large enough that the impedance of the resulting series capacitance $C_s$ is much smaller than the impedance of the capacitance, $C_d$, being measured. In the Grumman invention, the surface area of the pins is small so the impedance of the resulting series capacitance $C_s$ can be large comparable to the impedance of the capacitance, $C_d$, being measured. This can cause significant measurement errors, especially when $C_s$ changes with a change in surface curvature.

The inventive probe and process was used in a series of tests to confirm its performance to the predicted analytical model. Referring to FIG. 7, a number of materials were tested using the bulls-eye probe device and the EPROBE BASIC computer program.

An additional test sample set is given in FIG. 10. The two sets of data in the sample data file are for (1) using the probe directly on the surface of a sample and (2) using the probe on the surface of a 0.040" thick glass epoxy spacer placed on the surface of the sample. The two sets of answers give an idea of the repeatability. Independent measurement of the dielectric constant of Teflon was 2.04, so the probe measurement of 2.11-j0.019 and 2.14-j.045 is satisfactory for Teflon. Likewise Nylon was independently measured to be 3.10-j0.16, so 3.08-j.16 and 3.11-j.19 is satisfactory. The alumina was not independently measured, but was expected to be between 8 and 9; it was 8.16-j.15 and 8.56-j.22, which is also satisfactory.

In the drawings and specification, there has been set forth a preferred embodiment of the invention, and, although specific terms are employed, the terms are used in a generic and descriptive sense only and not for purposes of limitation, the scope of the invention being set forth in the following claims.

What is claimed and desired to be secured by Letters Patent of the United States is:

1. A device for measuring the dielectric characteristics of material samples by contacting the surface of the samples, said device including a probe connected to a coaxial like by a connector having an outer conductor and a central conductor, wherein the probe comprises:
   a flexible contact surface comprising a flexible nonconductive substrate, an external conductor mounted upon the substrate and an internal conductor mounted upon the substrate, said external and internal conductors adapted to establish contact with and to conform to a shape of the samples, said external conductor being in electrical contact with the outer conductor of the connector and said internal conductor being in electrical contact with the central conductor of the connector; and
   a probe housing in physical contact to the substrate of the flexible contact surface.

2. The device according to claim 1 in which said substrate is circuit board partially covered in a metal coating in two separated regions to form said external conductor and said internal conductor.

3. The device according to claim 1 in which said probe housing makes physical contact at the outer edges of one central axis of said flexible contact surface allowing deformation along simple curved surfaces.

4. The device according to claim 1 in which said probe housing makes physical contact with a resilient means allowing deformation of the contact surface on compound curved surfaces.

5. A method for measuring dielectric characteristics of a solid material including the steps of:
   calibrating a signal processing device having an electrical line;
   measuring a complex impedance of a bulls-eye dielectric probe attached to the electrical line, said measurement of the complex impedance of the bulls-eye dielectric probe comprising:
      determining if the solid material is covered with a dielectric material;
      measuring the complex impedance of the bulls-eye dielectric probe based upon a dielectric spacer if the solid material is covered with a dielectric material; and measuring the complex impedance of the bulls-eye dielectric probe based upon the presence of an air gap if the solid material is free of dielectric material;

measuring a complex impedance of the solid material; and calculating a dielectric constant of the solid material based on an analytical model of a coaxial cable radiating into semi-infinite space taking into account the complex impedance of the bulls-eye dielectric probe and the solid material.

6. The device according to claim 2 in which the internal conductor region is circular and the external conductor region is a ring surrounding the internal conductor region.

7. The method of claim 5 in which the electrical line is a coaxial cable.

8. The method of claim 7 in which the signal processing device is a vector impedance meter.

9. The method of claim 8 in which the step of calibrating the vector impedance meter with coaxial cable is comprised of the following steps:

connecting coaxial cable to the vector impedance meter;

calibrating vector impedance meter with an electrical short load;

calibrating vector impedance meter with an electrical open load;

calibrating vector impedance meter with a known electrical load.

10. The method of claim 9 in which the step of calibrating the vector impedance meter with the bulls-eye dielectric probe connected to the coaxial cable is comprised of the following steps prior to testing materials having a dielectric spacer:

connecting the bulls-eye dielectric probe to the coaxial cable;

measuring complex impedance of probe contact surface against air-backed dielectric spacer sheet sample;

measuring complex impedance of probe contact surface against dielectric spacer sheet sample which is in turn against a metal shorting block; and measuring complex impedance of probe contact surface against the metal shorting block.

11. The method of claim 9 in which the step of calibrating the vector impedance meter with the bulls-eye dielectric probe connected to the coaxial cable is comprised of the following steps prior to testing materials not having a dielectric spacer:

connecting the bulls-eye dielectric probe to the coaxial cable;

measuring complex impedance of probe contact surface exposed to air; and measuring complex impedance of probe contact surface against a metal shorting block.

* * * * *